United States Patent
Druz et al.

(10) Patent No.: US 7,879,201 B2
(45) Date of Patent: Feb. 1, 2011

(54) METHOD AND APPARATUS FOR SURFACE PROCESSING OF A SUBSTRATE

(75) Inventors: Boris Druz, Brooklyn, NY (US); Viktor Kanarov, Bellmore, NY (US); Hariharakeshave S. Hegde, Little Neck, NY (US); Alan V. Hayes, Centerport, NY (US); Emmanuel Lakios, Mount Sinai, NY (US)

(73) Assignee: Veeco Instruments Inc., Woodbury, NY (US)

( * ) Notice: Subject to any disclaimer, the term of this patent is extended or adjusted under 35 U.S.C. 154(b) by 939 days.

(21) Appl. No.: 10/915,745

(22) Filed: Aug. 11, 2004

(65) Prior Publication Data

US 2005/0034979 A1    Feb. 17, 2005

Related U.S. Application Data

(60) Provisional application No. 60/494,281, filed on Aug. 11, 2003.

(51) Int. Cl.
| | |
|---|---|
| *C23C 14/00* | (2006.01) |
| *C23C 14/32* | (2006.01) |
| *C25B 9/00* | (2006.01) |
| *C25B 11/00* | (2006.01) |
| *C25B 13/00* | (2006.01) |

(52) U.S. Cl. .............. 204/192.11; 204/192.12; 204/192.32; 204/192.34; 204/298.11; 204/298.27

(58) Field of Classification Search .......... 118/718; 204/192.11, 192.12, 298.11, 192.32, 192.34, 204/298.27; 216/22; 250/492.1; 359/350
See application file for complete search history.

(56) References Cited

U.S. PATENT DOCUMENTS 3,778,626 A * 12/1973 Robertson ............ 250/492.1

(Continued)

FOREIGN PATENT DOCUMENTS

DE    102004018079 A1    10/2005

(Continued)

OTHER PUBLICATIONS

Veeco, "6×66cm RF Linear Ion Source", Product Brochure, copyright 2002 (2 pages).

(Continued)

*Primary Examiner*—Alexa D Neckel
*Assistant Examiner*—Michael Band
(74) *Attorney, Agent, or Firm*—Wood, Herron & Evans, LLP

(57) ABSTRACT

Method and apparatus for processing a substrate with a beam of energetic particles. The beam is directed from a source through a rectangular aperture in a shield positioned between the source and substrate to a treatment zone in a plane of substrate movement. Features on the substrate are aligned parallel to a major dimension of the rectangular aperture and the substrate is moved orthogonally to the aperture's major dimension. The beam impinges the substrate through the aperture during movement. The substrate may be periodically rotated by approximately 180° to reorient the features relative to the major dimension of the rectangular aperture. The resulting treatment profile is symmetrical about the sides of the features oriented toward the major dimension of the rectangular aperture.

15 Claims, 8 Drawing Sheets

U.S. PATENT DOCUMENTS

| | | | | |
|---|---|---|---|---|
| 4,793,908 A | * | 12/1988 | Scott et al. | 204/192.26 |
| 4,814,056 A | * | 3/1989 | Welty | 204/298.11 |
| 4,992,298 A | * | 2/1991 | Deutchman et al. | 427/524 |
| 5,067,781 A | * | 11/1991 | Montanari et al. | 359/350 |
| 5,334,302 A | * | 8/1994 | Kubo et al. | 204/298.18 |
| 5,340,454 A | * | 8/1994 | Schaefer et al. | 204/192.12 |
| 5,879,519 A | * | 3/1999 | Seeser et al. | 204/192.12 |
| 5,973,447 A | | 10/1999 | Mahoney et al. | |
| 6,045,671 A | * | 4/2000 | Wu et al. | 204/298.11 |
| 6,056,826 A | | 5/2000 | Rick et al. | |
| 6,238,582 B1 | | 5/2001 | Williams et al. | 216/22 |
| 6,402,906 B1 | | 6/2002 | Pichulo et al. | 204/192.15 |
| 6,419,803 B1 | * | 7/2002 | Baldwin et al. | 204/192.13 |
| 6,495,010 B2 | * | 12/2002 | Sferlazzo | 204/298.27 |
| 6,579,420 B2 | | 6/2003 | Wan et al. | 204/192.11 |
| 6,716,322 B1 | | 4/2004 | Hedge et al. | 204/192.11 |
| 2005/0005846 A1 | * | 1/2005 | Selvamanickam et al. | 118/718 |

FOREIGN PATENT DOCUMENTS

| | | |
|---|---|---|
| JP | 2001247963 A | 9/2001 |

OTHER PUBLICATIONS

European Patent Office, International Search Report issued in corresponding PCT Application serial No. PCT/US2008/076835 dated Nov. 28, 2008.

'Ion source' Retrieved from the internet http://en.wikipedia.org/wiki/Ion_source on Mar. 16, 2009.

'Ion source' Retrieved from the internet http://www.encarta.co.uk/dictionary_1861818273/ion_source.html on Mar. 16, 2009.

'Ion source' Retrieved from the internet http://www.answers.com/topic/ion-source on Mar. 16, 2009.

* cited by examiner

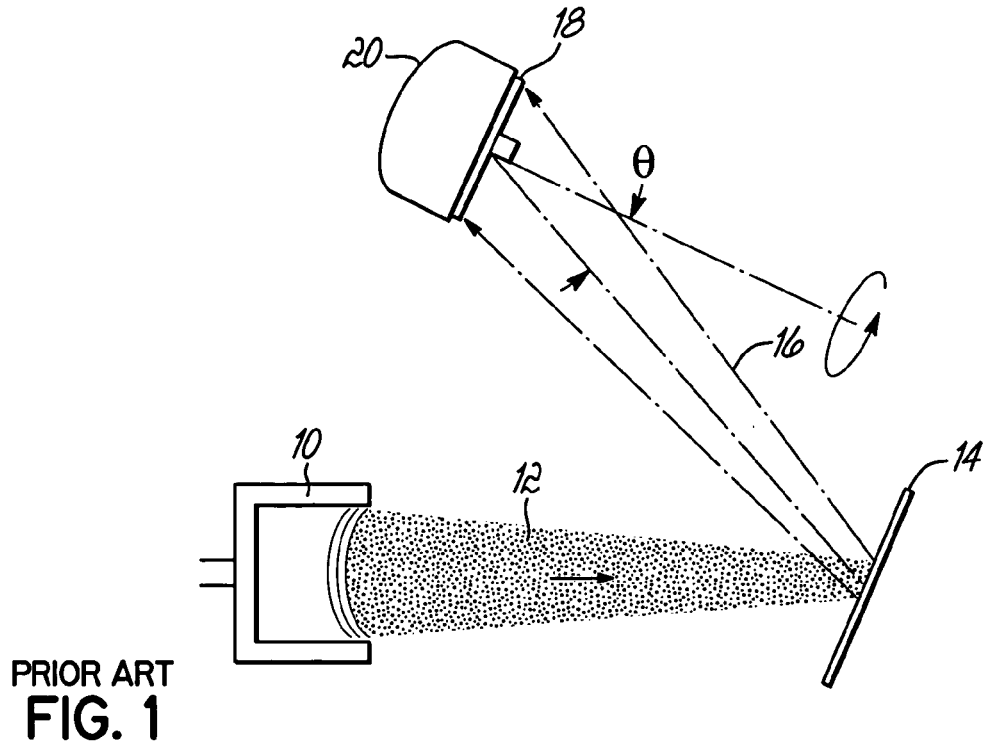
PRIOR ART
FIG. 1
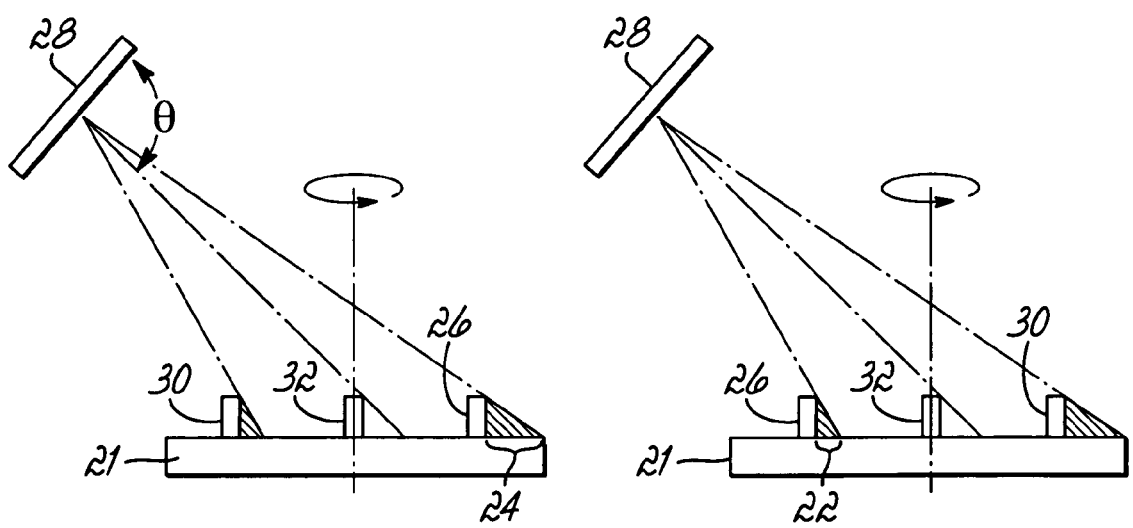
PRIOR ART
FIG. 2A
PRIOR ART
FIG. 2B

METHOD AND APPARATUS FOR SURFACE PROCESSING OF A SUBSTRATE

CROSS REFERENCE TO RELATED APPLICATIONS

The present application claims benefit of U.S. Provisional Application Ser. No. 60/494,281, filed Aug. 11, 2003, the disclosure of which is hereby incorporated herein by reference in its entirety.

FIELD OF THE INVENTION

This invention relates generally to materials processing and, more particularly, to apparatus and methods for processing or treating the surface of a substrate with a beam of energetic particles.

BACKGROUND OF THE INVENTION

Sputter deposition and ion beam deposition (IBD) are familiar methods for depositing thin film materials. These deposition processes require deposition on substrates with particular topographical features that affect the distribution and properties of deposited material across the substrate. For example, lift-off deposition processes in which thin films are deposited over a pattern of photoresist features are used in many important thin film device fabrication processes.

IBD is particularly well suited for lift-off deposition processes due to some unique advantages of the process, including low process pressures and directional deposition. As a result, the lift-off step is extremely clean and repeatable down to critical dimensions less than 0.5 microns. Primarily because of these advantages, IBD has become the dominant method for depositing stabilization layers for thin film magnetic heads as a lift-off step is required subsequent to the deposition of the stabilizing material. In addition to good lift-off properties, IBD films have extremely good magnetic properties. The substrate may be tilted to different angles to optimize the properties of the IBD deposited film and rotated to average out non-uniformities introduced by the tilting.

With reference to FIG. 1, an IBD system generally includes a deposition gun 10 that directs an energized beam 12 of ions to a target 14 of material to be deposited. The ion beam 12 sputters material from a finite, well-confined source region on the target 14 to generate a beam 16 of sputtered target material. A substrate 18 is held on a fixture 20 and positioned so that the beam 16 impinges the substrate 18. The target 14 is approximately the size of substrate 18, which is located the equivalent of a few substrate diameters away from the target 14. The fixture 20 is configured to tilt the normal to the surface of substrate 18 at an angle θ relative to the direction of the deposition flux 16 and to continuously rotate the substrate 18 about the surface normal.

The divergence angle of the beam 16 depends on the geometrical relationship between the target 14 and substrate 18. One contribution to the divergence angle arises because the ion beam 12 is focused on the target 14 to prevent ion beam sputtering of nearby components in the process chamber. Another contribution to the divergence angle originates from the target-to-substrate distances that are limited due to the deposition rate reduction.

Beam divergence in IBD systems cause asymmetrical shadowing of the substrate surface by the features projecting from the substrate surface, such as the features characterizing a photoresist pattern. This causes the deposited material to have an asymmetric deposition profile relative to the features, which reduces the area over which lift-off is acceptable and reduces magnetic property uniformity.

The substrate may be oriented relative to the flux direction so that its surface normal is aligned with the line of sight between substrate and the deposition flux source region on the sputter target, which is typically the center of the target, and rotated about its centerline. Under these circumstances, the substrate is not shadowed by the feature on the inboard or radially-innermost side of the feature. In contrast, the substrate will always be shadowed by the feature on the outboard or radially-outermost side of the feature. The degree of shadowing on the outboard side increases with increasing radial separation between the feature and the substrate centerline and also with increasing divergence of the deposition flux. The resulting deposition profile is highly asymmetrical.

Tilting the surface normal with respect to the line of sight between the target and the substrate during deposition improves the symmetry of the deposition profile by reducing the substrate shadowing on the outboard side of features. However, the nature of the substrate shadowing on the outboard and inboard sides of the feature depends on the azimuthal position of the feature as the substrate is rotated, as described below.

FIGS. 2A and 2B illustrate the shadow cast on a substrate 21 by the inboard side and the outboard side of a feature 26 projecting from substrate 21 at a location between the substrate center and peripheral edge. FIG. 2A shows the feature 26 with the substrate 21 oriented at a first azimuthal angle and tilted relative to a target 28 of an IBD system. The outboard side of the feature 26 shadows the substrate 21 over a distance 24. The inboard side of the feature 26 does not shadow the substrate 21. FIG. 2B shows feature 26 with the substrate 21 oriented at a second azimuthal angle that locates feature 26 at an angular position diametrically opposite to the position at the first azimuthal angle. The inboard side of the feature 26 shadows the substrate 21 over a distance 22, which is a smaller distance than distance 24. The outboard side of the feature 26 does not shadow the substrate 21 at the second azimuthal angle.

Despite substrate tilting, the shadowing of the substrate 21 over distance 24 on the outboard side of the feature 26 differs from the shadowing of the substrate 21 over distance 22 by the inboard side. In particular, the profile of the deposited material will differ on the inboard and outboard sides of the feature 26 adjacent to the sidewalls of feature 26. Specifically, the longer shadow cast over distance 24 adjacent to the outboard side results in a relatively longer taper of the deposited material than adjacent to the inboard side.

The shadowed substrate region on the outboard side of the feature 26 also experiences a lower deposition rate because it is effectively further away from the target 28 when the substrate 21 is oriented at the first azimuthal angle. The inboard substrate region experiences a higher deposition rate because it is closer to the target 28 when the substrate 21 is oriented at the second azimuthal angle. Therefore, the deposited material is thinner on the outboard side of feature 26, due to the outboard region being further away from the target 28. The asymmetry and difference in deposition rate, which originate from the beam divergence of the target 28, increase with increasing radial distance from the center of substrate 21.

Feature 30, which is at the same radial distance from the substrate center as feature 26, experiences the same asymmetries and differences in deposition rate as feature 26. On the other hand, the deposited material is radially symmetrical about feature 32 at the substrate center because feature 32 symmetrically shadows the substrate 21 adjacent to its sidewalls. Other types of surface treatments, such as etching, will have similar asymmetrical treatment profiles about the features 26 and 30.

It would therefore be desirable to provide a deposition method capable of eliminating or, at the least, significantly reducing the inboard and outboard asymmetries of the deposited material adjacent to a feature projecting from the surface of a substrate.

SUMMARY OF THE INVENTION

In accordance with an embodiment of the invention, a system for processing a substrate includes a vacuum chamber, a source positioned inside the vacuum chamber, a fixture adapted to hold the substrate inside the vacuum chamber at a position spaced from the source, and a shield positioned between the source and the fixture. The source is configured to emit a beam of energetic particles having a substantially uniform flux distribution across a major dimension. The fixture is configured to translate the substrate in a plane spaced from, and generally parallel with, a plane containing the source. The fixture is also configured to orient the substrate angularly relative to the source. The shield includes a rectangular aperture having a major dimension oriented substantially parallel to the major dimension of the source. The source is arranged relative to the rectangular aperture to transmit the beam over a treatment area in the plane of the substrate. The fixture is adapted to translate the substrate substantially perpendicular to the major dimension of the rectangular aperture for passing the substrate through the treatment area so that the energetic particles in the beam treat the substrate.

The location of the rectangular aperture may be movable with respect to the source for changing the average incident angle of the beam relative to the surface normal of the substrate. The rectangular aperture may also have an adjustable width in a direction perpendicular to the major axis or dimension of the source for changing the angular divergence of the flux of energetic particles in the beam.

In accordance with another embodiment of the invention, a method of processing a substrate includes directing a beam of energetic particles having a substantially uniform flux distribution over a major dimension through a rectangular aperture having a major dimension oriented substantially parallel to the major dimension of the source and orienting the substrate such that a plurality of parallel features on the substrate are aligned substantially parallel to the major dimension of the rectangular aperture. The method further includes providing mutual orthogonal movement between the substrate and the beam of energetic particles and exposing the substrate to the beam of energetic particles transmitted through the rectangular aperture.

Preferably, the mutual orthogonal movement comprises moving the substrate substantially orthogonal to the major dimension of the rectangular aperture. Processing may be performed on one side of the feature if the substrate is moved relative to the aperture without rotation. Alternatively, the substrate may be processed adjacent to both sides of the feature if the substrate is rotated 180° after each cycle of the substrate surface treatment, as described herein.

Various objects and advantages of the invention shall be made apparent from the accompanying drawings of the illustrative embodiment and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 1 is a diagrammatic view of a conventional IBD system in accordance with the prior art;

FIGS. 2A and 2B are diagrammatic views illustrating the asymmetrical deposition profile for features on a substrate of the conventional IBD system of FIG. 1;

DETAILED DESCRIPTION OF THE PREFERRED EMBODIMENTS

Figure 3:
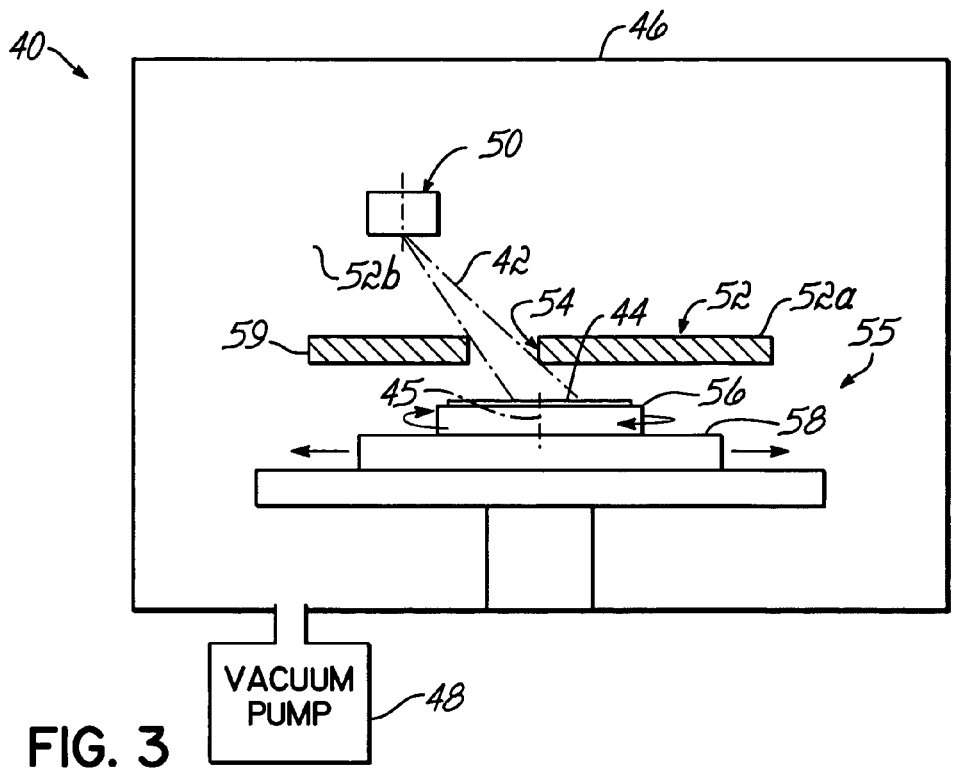
FIG. 3 is a diagrammatic side view of a substrate processing apparatus in accordance with the invention.
Figure 3A:
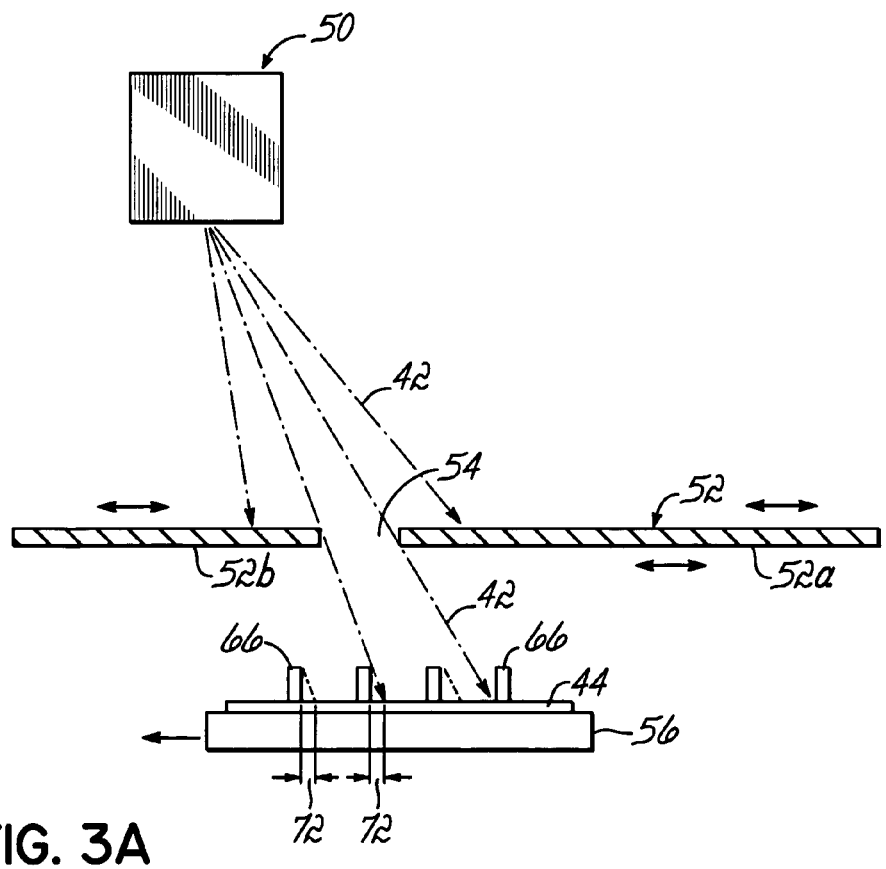
FIG. 3A is a detailed view of a portion of FIG. 3.
Figure 4A:
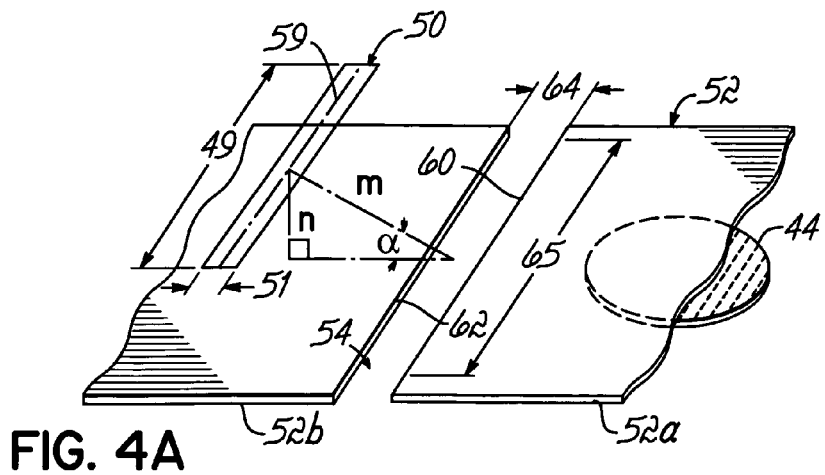
FIGS. 4A and 4B are diagrammatic perspective views of the substrate processing apparatus of FIG. 3 illustrating the geometrical relationships between the source, the aperture, and the substrate.

With reference to FIGS. 3 and 3A, a processing apparatus 40 includes a source 50, which is preferably rectangular but not so limited, adapted to emit a beam 42 of energetic particles. The energetic particles from source 50 may etch a substrate 44, deposit a thin film or layer of material on substrate 44, or otherwise treat substrate 44. The source 50 may have a geometrical shape similar to the geometrical shape of aperture 54, which reduces the unused portion of the beam 42 from the source 50 that does not treat the substrate 44. The source 50 is characterized by a major dimension 49 (FIG. 4A) and a minor dimension 51 (FIG. 4A). Beam 42 has a substantially uniform flux distribution along the major dimension 49 of the source 50.

The apparatus 40 includes a vacuum chamber 46 that is isolated from the surrounding environment. Vacuum chamber 46 may be evacuated to a suitable vacuum pressure by a vacuum pump 48 as recognized by a person of ordinary skill in the art. A sealable port (not shown) is provided in the vacuum chamber 46 for accessing the interior of vacuum chamber 46 to exchange processed substrates 44 for unprocessed substrates 44.

The source 50 of beam 42 is any ion beam source capable of generating energetic particles for performing a thin film deposition, an etching process, a reactive ion etching process, a sputtering process, or other ion beam treatment. For example, the source 50 may be a magnetron with a sputtering target of any material that provides thin film deposition. Another example is a rectangular ion beam source 50 with flat or dished grid ion optics to emit ions in direction to the aperture 54 that provides a substrate surface etch. In a preferred embodiment of the invention, the source 50 is an ion beam deposition (IBD) source including a target of deposition material sputtered by a beam of inert gas ions and a magnetron confining a plasma proximate to the target that provides the source of the gas ions. Such sources 50 and, in particular, rectangular sources 50, require no further description herein in order to be understood by persons of ordinary skill.

A shield 52 is positioned between the substrate 44 and the source 50 so that the substrate 44 and source 50 are positioned in different parallel planes. The aperture 54 is located in a plane that is substantially parallel to the plane of the substrate 44. The shield 52 has a rectangular opening or aperture 54 characterized by a major axis or dimension 65 (FIG. 4A) substantially aligned with the major dimension 49 (FIG. 4A) of the source 50 along which beam 42 is uniform. The aperture 54 in shield 52 collimates beam 42 so that only a fraction of energetic particles emitted from source 50 are transmitted through the aperture 54 and strike the substrate 44 to thereby treat the substrate 44. Typically, the major dimension 65 (FIG. 4A) of aperture 54 is greater than the diameter of substrate 44 and the minor dimension 64 (FIG. 4A) of aperture 54 is less than or equal to the diameter of substrate 44.

With continued reference to FIGS. 3 and 3A, the substrate 44 is held and supported by a two-stage fixture 55 having a rotational stage 56 adapted to rotate the substrate 44 in at least one rotational sense about an azimuthal axis 45. Rotation of the substrate 44 about the azimuthal axis 45 changes the orientation of features 66 (FIG. 5A) on the substrate 44 relative to the direction of the beam 42. A translational stage 58 of fixture 55, which supports the rotational stage 56, is adapted to move or translate the substrate 44 linearly and bi-directionally (i.e., reversibly) relative to the aperture 54. The translational stage 58 is movable over a range of motion adequate to position substrate 44 in flux-blocked positions on opposite sides of aperture 54 in which the shield 52 is interposed between the substrate 44 and source 50. The movements of stages 56 and 58 are mutually independent so that the substrate 44 may be translated by stage 58 without rotation and, conversely, the substrate 44 may be rotated by stage 56 without translation. The translational stage 58 translates the substrate 44 in a direction approximately orthogonal to the major dimension 65 (FIG. 4A) of aperture 54.

In an alternative embodiment of the invention, the translational stage 58 may be replaced by a planetary stage (not shown) that revolves the substrate 44 and rotational stage 56 about a relatively large radius of curvature in a plane parallel to the substrate plane. The radius of the curve traced by the substrate 44 when moved by the planetary stage is large enough to be approximately linear over the minor dimension 64 of aperture 54. Preferably, the center of the source 50 and aperture 54, and the arc traced by the center of fixture 55 are in a cylindrical plane with a radius of curvature exceeding the distance between the source 50 and aperture 54.

With reference to FIG. 4A, the position of aperture 54 with respect to the source 50 determines the incident angle at which energetic particles from the beam 42 (i.e., particle flux) impinge the substrate 44. The source 50 may be considered to be a line source having a centerline 59 extending across its major dimension 49. The average incident angle, $\alpha$, of the particle flux is defined as the inverse sine of the quotient of a dividend given by the perpendicular distance from the centerline 59 of source 50 to the plane of the shield 52, labeled with the alphanumeric character "n" in FIG. 4A, divided by a divisor given by the distance from the centerline 59 of the source 50 to the mid-line of the aperture 54 defined between edges 60, 62, labeled with the alphanumeric character "m" in FIG. 4A. As is apparent, the average incident angle increases (i.e., becomes more oblique) as the distance from centerline 59 to the center of aperture 54 increases.

Figure 4B:
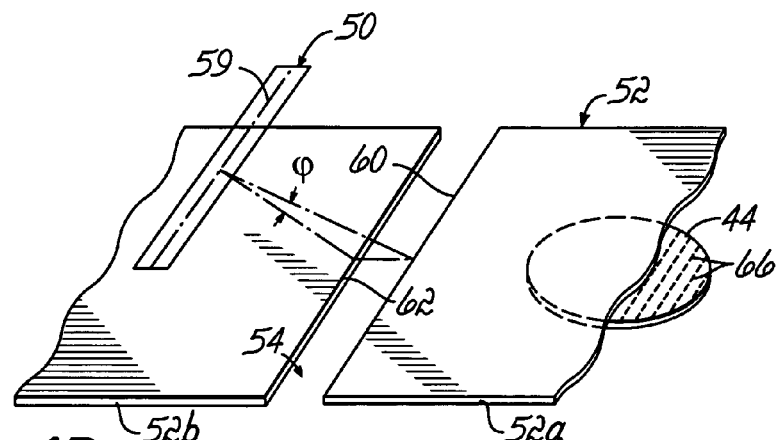

With reference to FIG. 4B, the minor dimension 64 (FIG. 4A) of the aperture 54 determines the collimation of beam 42. The collimation angle is determined from the angular arc subtended from the source 50 to the opposite edges 60, 62 of the aperture 54 and defines the angular distribution of the flux about the average incident angle. Edge 60 is most distant from source 50 and edge 62 is closest to source 50. The distance in the plane of the shield 52 between edges 60, 62 specifies the minor dimension 64 of the aperture 54. The aperture 54 also has a major dimension 65 orthogonal to the minor dimension 64. The collimation angle, $\phi$, is equal to the difference between the inverse cosine of the quotient of a dividend given by the distance, n, divided by a divisor given by the distance from the centerline 59 to edge 60 minus the inverse cosine of the quotient of a dividend given by the distance, n, divided by a divisor given by the distance from the centerline 59 to edge 62. As is apparent, the collimation angle for the deposition flux may be reduced by reducing the separation between edges 60, 62.

Figure 3B:
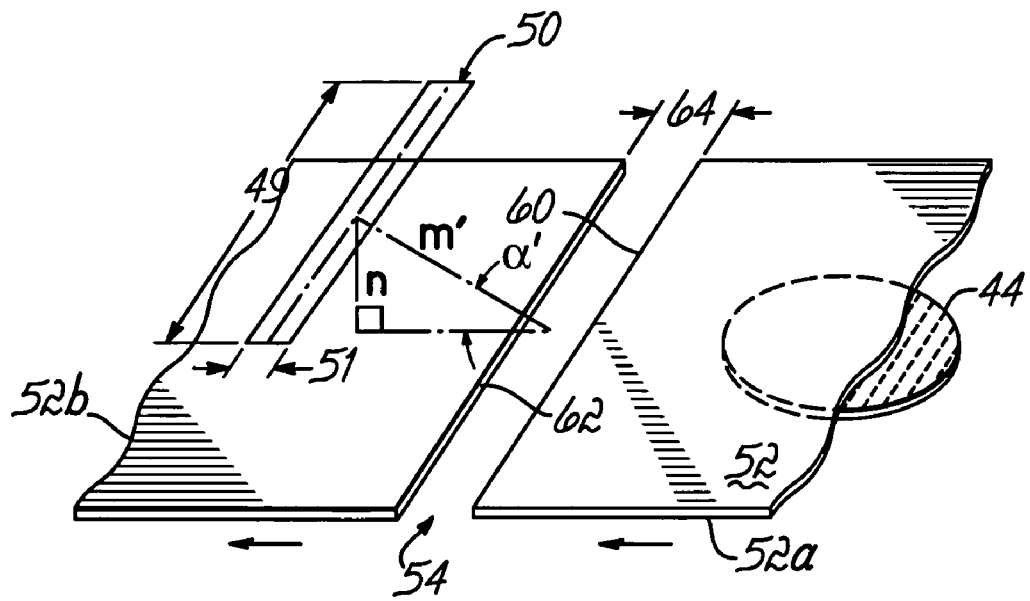
FIGS. 3B and 3C are diagrammatic perspective views of the shield of FIG. 3 showing the ability to adjust the position of the aperture relative to the source and the ability to adjust the width of the aperture, respectively.
Figure 3C:
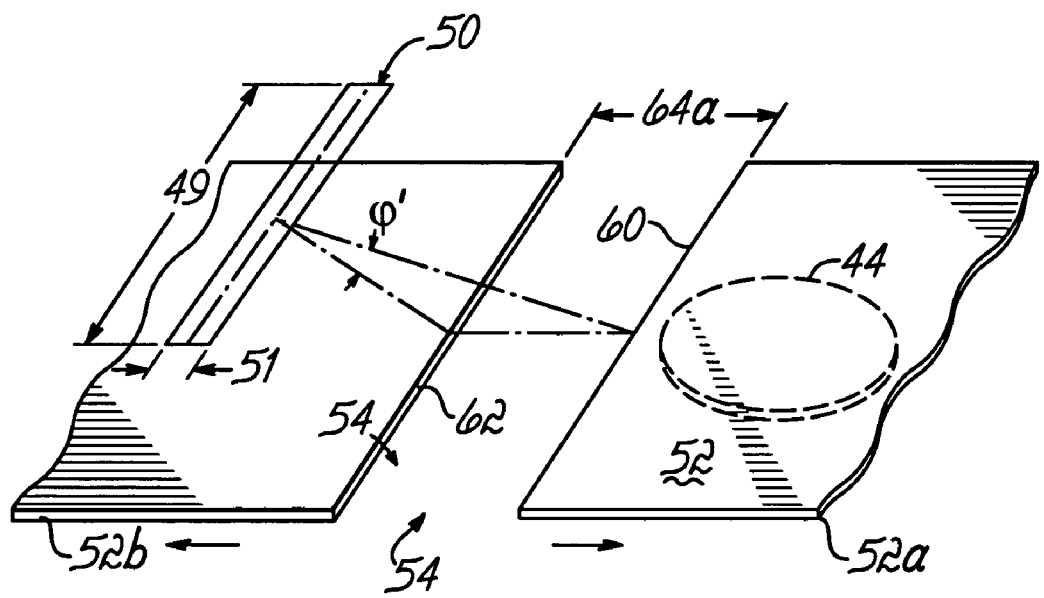

With reference to FIGS. 3B and 3C, the shield 52 may preferably include two members 52a, 52b that are relatively movable in a direction perpendicular to the major dimension 49 (FIG. 4A) of the source 50. The location of the aperture 54 may be adjusted relative to the source 50 by moving the members 52a, 52b toward or away from the source 50, as shown in FIG. 3B. This relocation of the aperture 54 is effective for changing the average incident angle of the beam 42 relative to the plane of the substrate 44. The movement of members 52a, 52b is illustrated as increasing the average incident angle relative to the arrangement shown in FIG. 4A, although not so limited. The minor dimension 64 (FIG. 4A) of aperture 54 may be adjusted by moving the members 52a, 52b relative to each other so that the distance between edges 60, 62 changes, as shown in FIG. 3C. This width adjustment of aperture 54 is effective for changing the collimation angle of the beam 42 across the treatment area. The movement of members 52a, 52b is illustrated as increasing distance to provide a minor dimension 64a greater than minor dimension 64 (FIG. 4B), which increases the collimation angle relative to the arrangement shown in FIG. 4B. However, moving the edges 60, 62 of the members 52a, 52b closer together will decrease the collimation angle relative to the arrangement shown in FIG. 4B.

With reference to FIGS. 5-13 in which like reference numerals refer to like features in FIGS. 3, 3A, 4A, and 4B, a method of exposing the substrate 44 to a beam 42 of energetic particles is described that provides a symmetrical treatment profile on opposite sides of features 66 projecting upwardly from the substrate 44. Beam 42 will be described as a beam of deposition material that incrementally accumulates as a thin film on substrate 44, although the invention is not so limited. Alternatively, the beam 42 may etch the substrate 44 by sputtering, chemical reaction, or a combination thereof, remove contaminants from the surface of substrate 44, or perform another type of ion beam treatment of substrate 44. The method will be described in terms of a single processing cycle or sequence including two distinguishable half-cycles, which may be repeated or iterated to thicken the deposited thin film or achieve the desired surface treatment.

Figure 5:
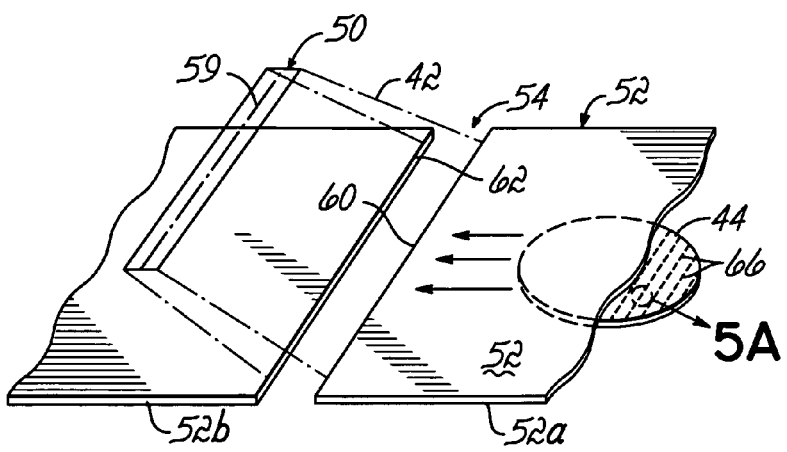
FIG. 5 is a diagrammatic perspective view of the substrate processing apparatus of FIG. 3 at an initial stage of a processing method in accordance with an embodiment of the invention.
Figure 5A:
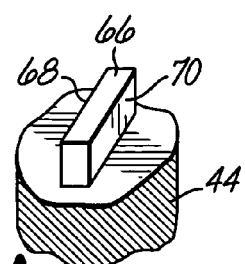
FIG. 5A is a detailed view of a portion of FIG. 5 illustrating the orientation of one of the features projecting from the substrate during processing.

With specific reference to FIGS. 5 and 5A, substrate 44 is loaded onto the fixture 55 in a home position in which the substrate 44 is shielded from source 50 by the shield 52. Accordingly, the beam 42 does not treat the substrate 44 in the home position. While the substrate 44 is stationary in the home position, the rotational stage 56 of fixture 55 aligns substrate 44 so that each of the features 66, exemplified by feature 66 visible in FIG. 5A, has opposite first and second sidewalls 68, 70 aligned generally parallel with the major dimension 65 of the aperture 54 and so that sidewall 68 is closest to edge 60.

The features 66 may be, for example, portions of a patterned photoresist layer. To that end, resist is applied by, for example, a spin-on process to substrate 44, exposed with radiation projected through a photomask to impart a latent projected image pattern characteristic of features 66, and developed to transform the latent image pattern into a final image pattern. The resist is stripped from the substrate 44 after the substrate 44 is treated by beam 42. The features 66 of the patterned resist may be used as a mask in a lift-off process following deposition of the layer 71 of deposition material in processing apparatus 40.

The source 50 is energized to generate the beam 42 of energetic particles, which are directed toward the rectangular aperture 54 in the shield 52. The projection of the beam 42 through the aperture 54 defines a treatment area in the plane of the substrate 44. The substrate 44, when positioned in the treatment area by fixture 55, is exposed to the energetic particles of beam 42.

Figure 6:
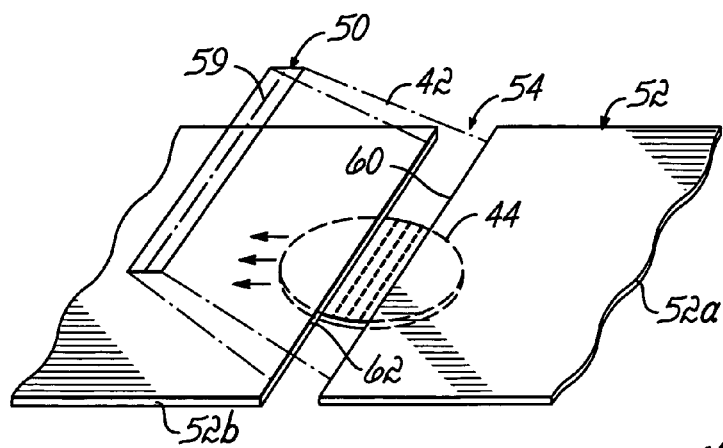
FIG. 6 is a diagrammatic perspective view of the substrate processing apparatus of FIG. 3 at a subsequent stage of the processing method.
Figure 6A:
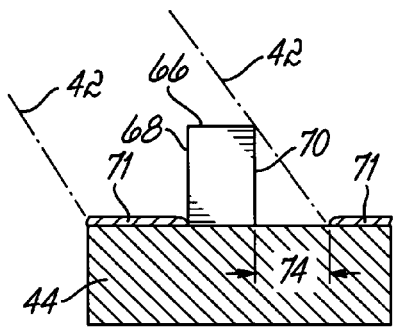
FIG. 6A is a cross-sectional view of the feature of FIG. 5A receiving treatment while being translated past the aperture during processing.

With reference to FIGS. 6 and 6A, the translational stage 58 of fixture 55 translates the substrate 44 in a plane below the shield 52 and past the rectangular aperture 54. The translation is in a direction substantially orthogonal to the major dimension 65 of the aperture 54. While the substrate 44 is in the line of sight between the source 50 and aperture 54, the beam 42 impinges the exposed surface of the substrate 44 and the energetic particles in the beam 42 provide the surface treatment. In this exemplary embodiment, the energetic particles in beam 42 are resident in a layer of deposition material 71 deposited on the substrate 44.

Layer 71 extends up to the base of the sidewall 68 of feature 66, as feature 66 does not block the line-of-sight of beam 42 to substrate 44 proximate to the base of sidewall 68. However, feature 66 shadows the substrate 44 adjacent to sidewall 70 over a width 74. As a result, energetic particles from beam 42 do not impinge the portion of substrate 44 adjacent to sidewall 70, and layer 71 does not accumulate or thicken over width 74 during this segment of the cycle.

Because each feature 66 is exposed continuously to beam 42 over the entire extent of the apparatus collimation angle (FIG. 4B), beam divergence across the minor dimension 64 (FIG. 4A) between edges 60, 62 does not cause variations in the profile of layer 71 adjacent to sidewall 70 among features 66 at different locations on substrate 44. In addition, the uniformity of the flux distribution of beam 42 along its major axis 49 promotes uniformity in the profile and thickness of layer 71 across the surface of substrate 44.

Figure 7:
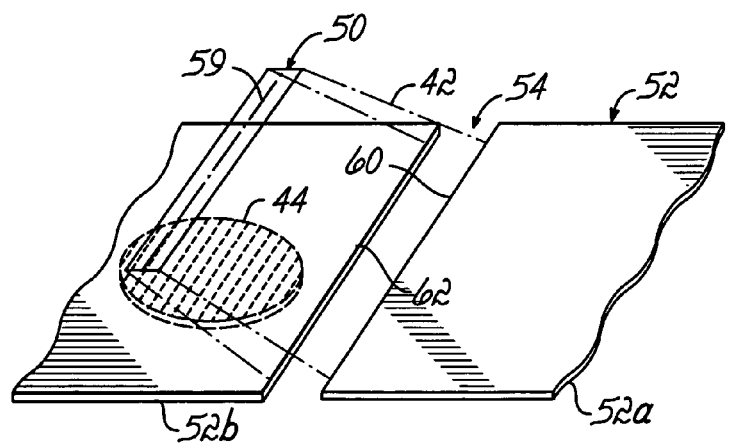
FIGS. 7-9 are diagrammatic perspective views of the substrate processing apparatus of FIG. 6 at subsequent stages of the processing method.
Figure 8:
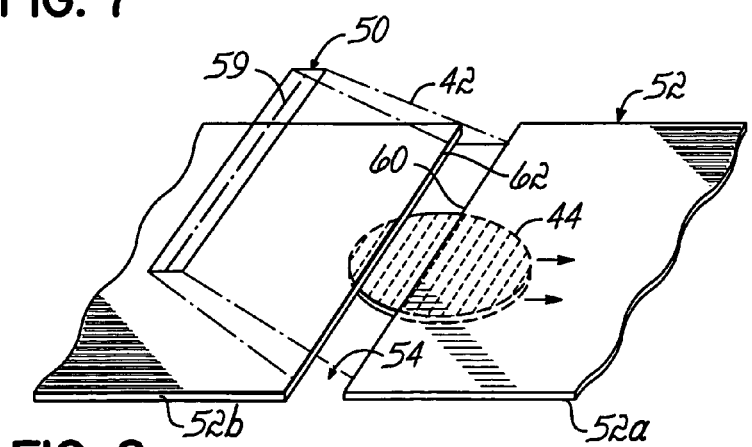

With reference to FIGS. 7 and 8, the motion of the translational stage 58 is stopped at an end point beneath the shield 52 after passing the rectangular aperture 54. At the end point, the substrate 44 is stationary and the beam 42 is blocked by shield 52 from reaching substrate 44. The translation direction of stage 58 is then reversed so that the substrate 44 moves back toward the rectangular aperture 54 in a direction again substantially orthogonal to the major dimension 65 of the aperture 54. The exposed surface of substrate 44 is again exposed to beam 42 while in the treatment area so that the energetic particles in the beam 42 provide the surface treatment. Another thickness of layer 71 deposits on the substrate 44. Layer 71 again accumulates or thickens uniformly up to the base of sidewall 68 because, over the return path to the home position, feature 66 still does not block the line-of-sight of beam 42 to substrate 44 proximate to the base of sidewall 68. However, the feature 66 again shadows the substrate 44 adjacent to sidewall 70 over width 74. As a result, energetic particles from beam 42 do not impinge the portion of substrate 44 adjacent to the base of sidewall 70 and, therefore, layer 71 does not accumulate or thicken over width 74 during this segment of the processing cycle.

Figure 9:
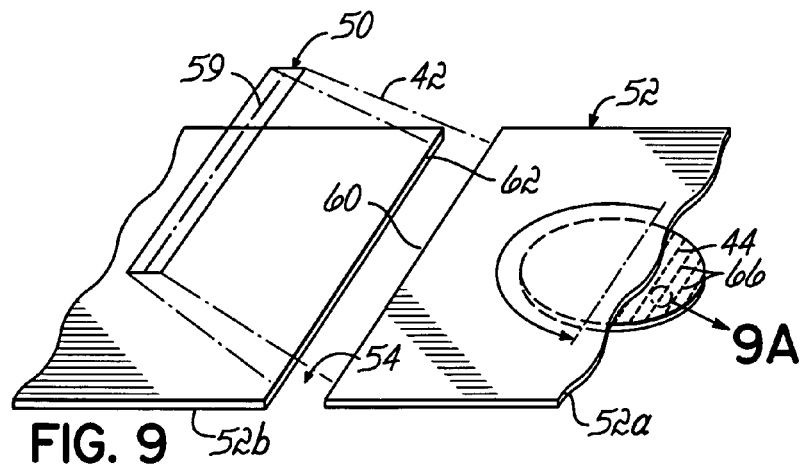
Figure 9A:
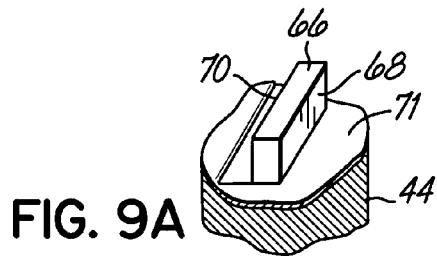
FIG. 9A is a detailed view illustrating the feature of FIG. 6A during processing after the substrate is rotated by 180° and immediately before the second half-cycle of the processing cycle.

With reference to FIG. 9, the translational stage 58 returns the substrate 44 to its home position in which beam 42 is blocked by shield 52 from reaching the substrate 44. While the fixture 55 is stationary in this home position, the rotational stage 56 rotates the substrate 44 by 180° so that sidewall 70 is closest to edge 60 and sidewall 68 is remote from edge 60. The sidewalls 68, 70 are aligned generally parallel with the major dimension 65 of the aperture 54 after the 180° rotation.

Figure 10:
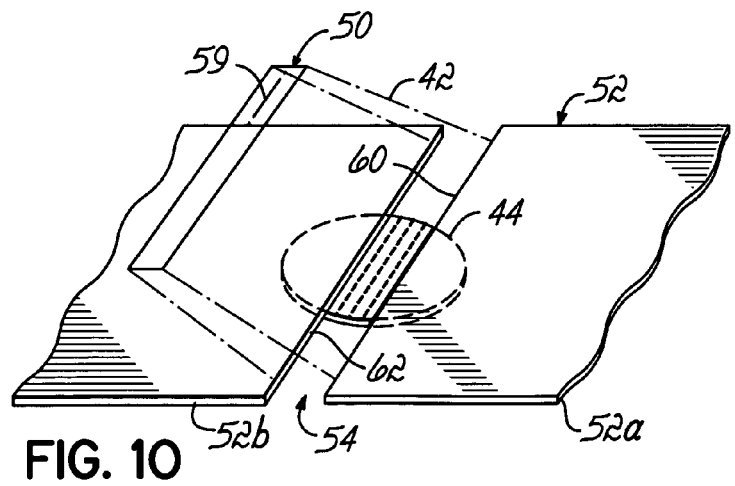
FIG. 10 is a diagrammatic perspective view of the substrate processing apparatus of FIG. 9 at a subsequent stage of the processing method.
Figure 10A:
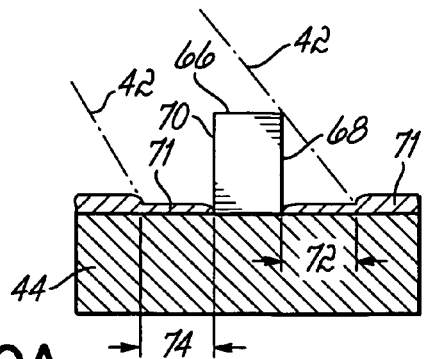
FIG. 10A is a cross-sectional view of the feature of FIG. 9A receiving treatment while being translated past the aperture with the feature reoriented by 180°.
Figure 11:
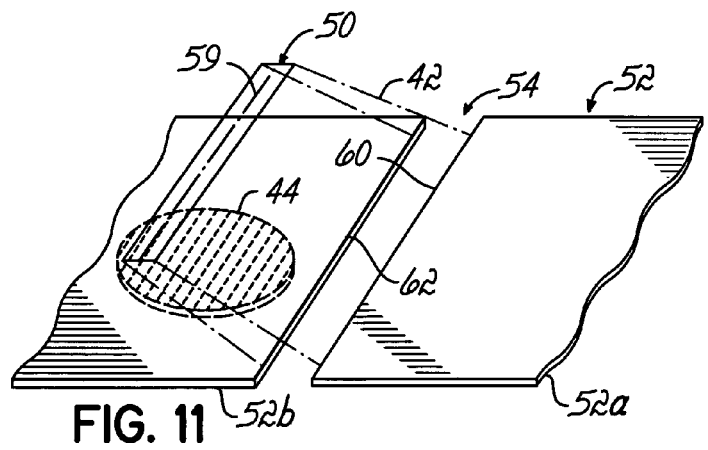
FIGS. 11-13 are diagrammatic perspective views of the substrate processing apparatus of FIG. 10 at subsequent stages of the processing method.
Figure 12:
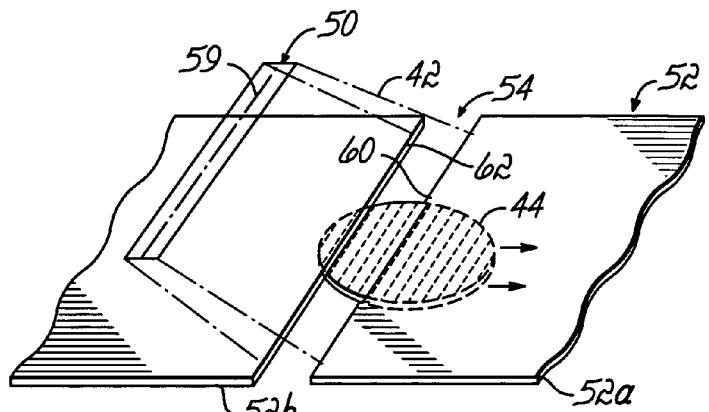

With reference to FIGS. 10-12, the procedure shown in FIGS. 6-8 is repeated so that the region of substrate 44 adjacent to the base of sidewall 70 (i.e., width 74 shown in FIG. 6A) receives a surface treatment identical to the region of substrate 44 adjacent to the base of sidewall 68 (i.e., width 72). In other words, the widths 72 and 74 are equal, neglecting the thickness of layer 71 forming on the substrate 44 across widths 72 and 74. While the substrate 44 is positioned beneath aperture 54 (FIGS. 10 and 12), energetic particles from the beam 42 treat the substrate 44. Accordingly, another thickness of layer 71 deposits on the substrate 44.

Layer 71 thickens up to the base of sidewall 70 over each of the two passes beneath the aperture 54 because feature 66 does not block the path of beam 42 to substrate 44 adjacent to the base of sidewall 70. However, feature 66 shadows the substrate 44 adjacent to sidewall 68 over width 72. As a result, energetic particles from beam 42 do not impinge the portion of layer 71 adjacent to sidewall 68 and layer 71 does not accumulate or thicken over width 72 during these segments of the cycle.

Figure 13:
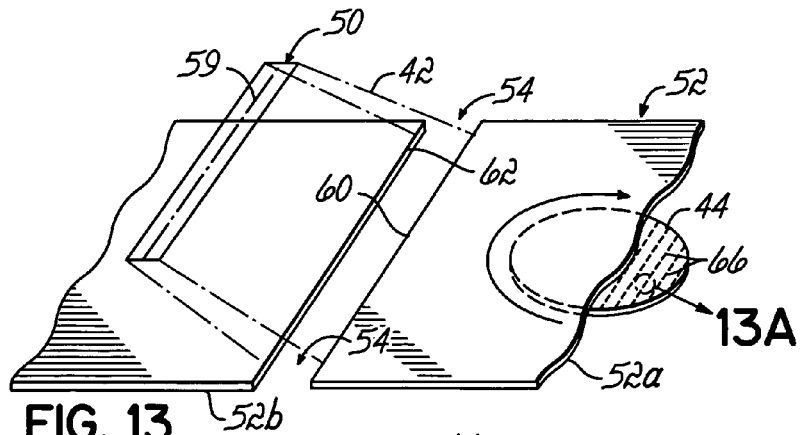
Figure 13A:
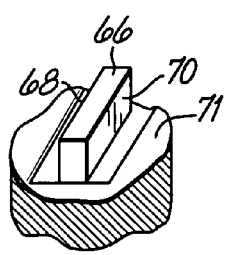
FIG. 13A is a detailed view of a portion of FIG. 13 illustrating feature orientation during processing and after a full cycle.

When the substrate 44 is returned by the translation stage 58 to the home position in FIG. 13, the rotational stage 56 rotates the substrate 44 by 180° so that sidewall 68 of feature 66 is again closest to edge 60. The procedure embodied in the segments of FIGS. 5-13 is repeated for a number of cycles sufficient to achieve a targeted processing result. For example and as described, the procedure may be repeated for a number of cycles sufficient to provide a targeted thickness of material deposition. Feature 66 may be removed from substrate 44 after the targeted thickness of deposition material in layer 71 is achieved.

In an alternative embodiment of the invention, the half-cycle depicted in FIGS. 6-8 may be repeated for a number of passes past aperture 54 with sidewalls 68, 70 aligned generally parallel with the major dimension 65 of the aperture 54 and sidewall 68 nearest to edge 60 and the substrate 44 rotated by 180°. Then, the half-cycle depicted in FIGS. 10-12 repeated for an equivalent number of cycles with sidewalls 68, 70 aligned generally parallel with the major dimension 65 of the aperture 54 and sidewall 70 nearest to edge 60. Preferably, the two half-cycles of the sequence alternate as described herein.

The result of the processing procedure is that neither sidewall 68, 70 constitutes an inboard or outboard side of feature 66 as the features 66 are alternatively aligned relative to the major dimension 65 (FIG. 4A) of the aperture 54 and translated relative to beam 42. This results in a symmetrical deposition or treatment profile on substrate 44 adjacent to the sidewalls 68, 70 of feature 66. In addition, the deposition or processing profile does not exhibit a radial dependence relative to the center of substrate 44.

In an alternative embodiment, the processing apparatus 40 may be employed to perform a static etch or other wafer surface treatment under oblique beam incidence. This embodiment eliminates the 180° rotation of substrate 44 in the home position after the conclusion of each half cycle. With reference to either the half cycle shown in FIGS. 5-9 or the half cycle shown in FIGS. 9-13, the substrate 44 is translated past the aperture 54 without using rotational stage 56 to change the angular orientation of the substrate 44.

In another alternative embodiment of the invention, the substrate 44 may be held stationary and the source 50 and aperture 54 are moved relative to the substrate 44 so that the deposition flux is scanned across the surface of the substrate 44.

Figure 14:
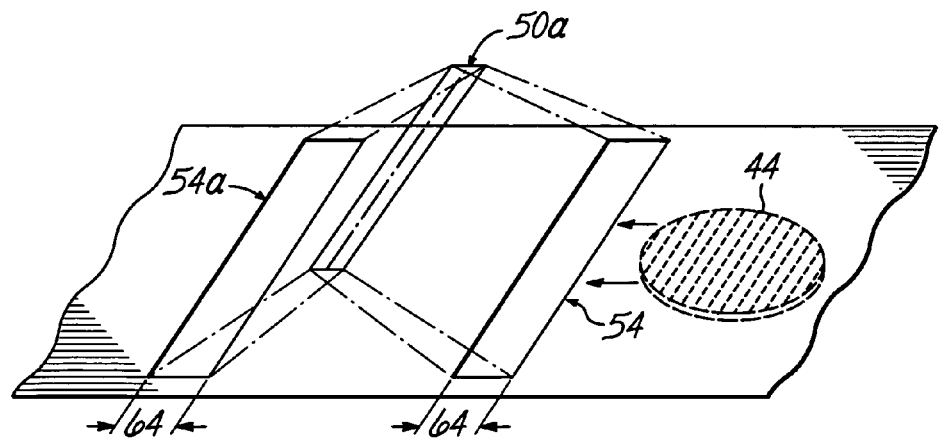
FIGS. 14 and 14A are diagrammatic perspective views of a substrate processing apparatus in accordance with an alternative embodiment of the invention.
Figure 14A:
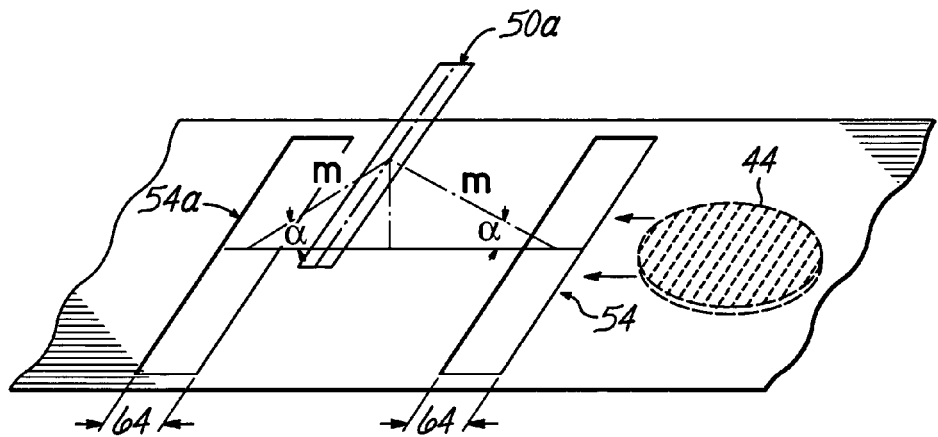

With reference to FIGS. 14 and 14A in which like reference numerals refer to like features in FIGS. 3-13 and in an alternative embodiment of the invention, the beam 42 emitted by a source 50a has a flux distribution of energetic particles that is symmetrical relative to the plane of the motion of fixture 55. Shield 52 includes a second rectangular aperture 54a that is identical in major dimension 64 and minor dimension 65 to rectangular aperture 54. The rectangular apertures 54, 54a are preferably positioned symmetrically relative to the centerline 59 of the source 50 (i.e., symmetrically to energetic particles plume distribution), although the invention is not so limited. This symmetry causes the surface treatment (e.g., deposition or etch) to be substantially identical adjacent to both sidewalls 68, 70 (FIG. 5A) of feature 66 when the substrate 44 is translated by the translational stage 58 past the rectangular apertures 54, 54a. This embodiment of the invention does not require a 180° rotation to produce symmetrical substrate treatment proximate to the base of the sidewalls 68, 70 of features 66 projecting from substrate 44.

Figure 15:
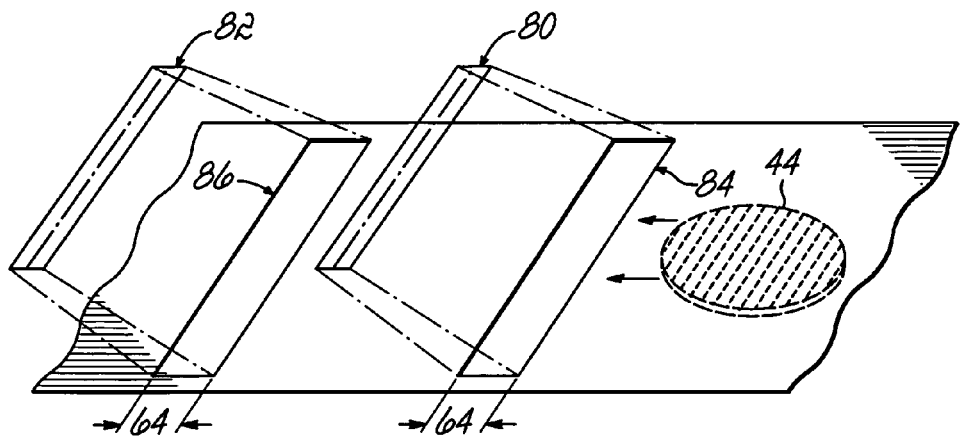
FIG. 15 is a diagrammatic perspective view of a substrate processing apparatus in accordance with another alternative embodiment of the invention.

With reference to FIG. 15 in which like reference numerals refer to like features in FIGS. 3-13 and in an alternative embodiment of the invention, the vacuum chamber 46 of processing apparatus 40 may include at least two sources 80, 82, each of which is substantially identical to source 50, in which the emitted energetic particles may have different or identical characteristics. Associated with each source 80, 82 is a corresponding one of at least two rectangular apertures 84, 86, each of which is substantially identical to aperture 54.

The apparatus 40 is configured and the source 80 and aperture 84 are arranged such that substrate 44 is impinged by energetic particles from source 80 only when in the line-of-sight of source 80 as viewed through aperture 84. Similarly, apparatus 40 is configured and source 82 and aperture 86 are arranged such that substrate 44 is impinged by energetic particles from source 82 only when in the line-of-sight of source 82 as viewed through aperture 86. The sources 80, 82 may be used to deposit individual layers of a multilayer structure. Alternatively, source 80 may be used to etch substrate 44 and source 82 may be used to deposit a layer on substrate 44, or source 80 may deposit a layer on substrate 44 and source 82 may be used to ion beam process the layer on substrate 44 under an oblique angle of incidence. Other combinations of surface treatments are contemplated by the invention, as is the presence of more than two sources and associated apertures inside vacuum chamber 46 for depositing additional layers, performing additional dry etches, or otherwise ion beam processing the substrate 44.

References herein to terms such as "vertical", "horizontal", etc. are made by way of example, and not by way of limitation, to establish a frame of reference. It is understood that various other frames of reference may be employed without departing from the spirit and scope of the invention. For example, a person of ordinary skill will recognize that the arrangement of the source 50 (FIG. 3) and the fixture 55 may be inverted so that the substrate 44 is above the source 50.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative methods, and illustrative examples shown and described. Accordingly, departures may be made from such details without departing from the spirit or scope of applicants' general inventive concept.

What is claimed is:

1. A method of processing a substrate having a surface with a plurality of features aligned with a parallel relationship and an azimuthal axis normal to the surface, the method comprising:

generating a beam of energetic particles having a substantially uniform flux distribution over a major dimension;

loading the substrate onto a movable fixture at a first flux-blocked position in which the substrate is not exposed to the beam of energetic particles;

operating the movable fixture to rotate the substrate about the azimuthal axis, while in the first flux-blocked position, so that the substrate is oriented about the azimuthal axis with a first angular orientation such that the features on the substrate are angularly aligned relative to the major dimension of the beam of energetic particles;

without changing the first angular orientation, translating the substrate substantially orthogonal to the major dimension of the beam of energetic particles; and without changing the first angular orientation and over a portion of the translation, exposing the substrate to the beam of energetic particles;

stopping the translation of the substrate when the substrate is at a second flux-blocked position in which the substrate is not exposed to the beam of energetic particles;

while the substrate is at the second flux-blocked position, rotating the substrate about the aziumuthal axis to a second angular orientation that reorients the features carried by the substrate relative to the major dimension of the first beam of energetic particles; and without changing the second angular orientation, reversing the translation of the substrate with the features reoriented relative to the major dimension of the beam of energetic particles so that the substrate is again exposed to the beam of energetic particles.

2. The method of claim 1 wherein generating the beam of energetic particles comprises:

directing the beam of energetic particles through an aperture positioned between the source having a major dimension oriented substantially parallel to the major dimension of the source.

3. The method of claim 1 wherein each of the features includes substantially parallel first and second opposite sides, and orienting the substrate comprises:

aligning one of the first and second sides with the major dimension of the beam of energetic particles.

4. The method of claim 2 further comprising:

adjusting a minor dimension of the aperture for defining a collimation angle of the beam of energetic particles; and adjusting the position of the aperture relative to the source for defining an average incident angle of the beam relative to the plane of the substrate.

5. The method of claim 1 wherein exposing the substrate comprises:

depositing a layer of material on the substrate that contains the energetic particles from the beam.

6. The method of claim 1 wherein exposing the substrate comprises:

sputtering material from the substrate with the energetic particles in the beam.

7. The method of claim 1 wherein exposing the substrate comprises:

etching material from the substrate with the energetic particles in the beam.

8. The method of claim 2 wherein translating the substrate comprises:

translating the substrate past the aperture multiple times for receiving treatment.

9. The method of claim 1 wherein generating the beam of energetic particles comprises:

energizing an ion source to generate the beam of energetic particles.

10. The method of claim 9 further comprising:

directing the beam of energetic particles through an aperture.

11. The method of claim 1 wherein translating the substrate further comprises:

translating the substrate in opposite first and second directions that are each approximately perpendicular to the major dimension of the beam of energetic particles.

12. The method of claim 11 further comprising:

stopping the translation of the substrate in the first direction at a first flux-blocked position in which the substrate is not exposed to the beam of energetic particles;

while at the first flux-blocked position, reversing the translation of the substrate from the first direction to the second direction;

stopping the translation of the substrate in the second direction at a second flux-blocked position in which the substrate is not exposed to the beam of energetic particles; and while at the second flux-blocked position, reversing the translation of the substrate from the second direction to the first direction.

13. The method of claim 12 wherein the substrate is periodically re-oriented about the azimuthal axis such that different portions of the features on the substrate are aligned with the first direction.

14. The method of claim 1 further comprising:

forming a symmetrical treatment profile on the substrate adjacent to opposite sidewalls of each of the features.

15. The method of claim 1 further comprising:

forming an asymmetrical treatment profile on the substrate adjacent to opposite sidewalls of each of the features.

* * * * *